(12) United States Patent
Matsui et al.

(10) Patent No.: US 12,243,870 B2
(45) Date of Patent: Mar. 4, 2025

(54) REVERSE-CONDUCTING SEMICONDUCTOR DEVICE

(71) Applicant: FUJI ELECTRIC CO., LTD., Kanagawa (JP)

(72) Inventors: Toshiyuki Matsui, Matsumoto (JP); Tatsuya Naito, Matsumoto (JP); Kazuki Kamimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 242 days.

(21) Appl. No.: 17/746,925

(22) Filed: May 17, 2022

(65) Prior Publication Data

US 2023/0036039 A1 Feb. 2, 2023

(30) Foreign Application Priority Data

Jul. 29, 2021 (JP) .................... 2021-123960

(51) Int. Cl.
*H01L 29/08* (2006.01)
*H01L 27/06* (2006.01)
(Continued)

(52) U.S. Cl.
CPC ...... *H01L 27/0664* (2013.01); *H01L 29/0661* (2013.01); *H01L 29/0804* (2013.01);
(Continued)

(58) Field of Classification Search
CPC ............. H01L 27/0664; H01L 29/0661; H01L 29/0804; H01L 29/32; H01L 29/7397; H01L 29/8613; H01L 27/0727; H01L 29/1095; H01L 29/417; H01L 29/0692; H01L 29/868; H01L 2924/12; H01L 29/407; H01L 21/768–76898; H01L 23/522–53295; H01L 2221/10–1094
See application file for complete search history.

(56) References Cited

U.S. PATENT DOCUMENTS

2016/0005844 A1   1/2016 Kimura
2017/0162563 A1*  6/2017 Kameyama ........... H01L 29/861
(Continued)

FOREIGN PATENT DOCUMENTS

JP   2010267863 A   11/2010
JP   2017168829 A    9/2017
(Continued)

*Primary Examiner* — Shahed Ahmed

(57) ABSTRACT

A semiconductor device, including a semiconductor substrate having a diode portion, wherein the diode portion includes: an anode region which is provided on a front surface of the semiconductor substrate and is of a second conductivity type; a trench portion provided so as to extend in a predetermined extending direction on the front surface of the semiconductor substrate; a trench contact portion provided on the front surface of the semiconductor substrate; and a plug region which is provided at a lower end of the trench contact portion and is of a second conductivity type, and which has a doping concentration higher than that of the anode region, wherein a plurality of plug regions, each of which being the plug region, is provided separately from each other along the extending direction, is provided.

17 Claims, 7 Drawing Sheets

(51) Int. Cl.
*H01L 29/06* (2006.01)
*H01L 29/32* (2006.01)
*H01L 29/739* (2006.01)
*H01L 29/861* (2006.01)

(52) U.S. Cl.
CPC .......... *H01L 29/32* (2013.01); *H01L 29/7397* (2013.01); *H01L 29/8613* (2013.01)

(56) References Cited

U.S. PATENT DOCUMENTS

| | | | |
|---|---|---|---|
| 2018/0374948 A1 | 12/2018 | Naito | |
| 2019/0027591 A1* | 1/2019 | Naito | ................... H01L 29/0696 |
| 2019/0267370 A1* | 8/2019 | Sato | .................... H01L 29/8611 |
| 2019/0371614 A1 | 12/2019 | Kanazawa | |

FOREIGN PATENT DOCUMENTS

| | | | |
|---|---|---|---|
| JP | 2019212663 A | 12/2019 | |
| WO | 2014125584 A1 | 8/2014 | |
| WO | 2018052098 A1 | 3/2018 | |

* cited by examiner

REVERSE-CONDUCTING SEMICONDUCTOR DEVICE

The contents of the following Japanese patent application(s) are incorporated herein by reference:
NO. 2021-123960 filed in JP on Jul. 29, 2021

BACKGROUND

1. Technical Field

The present invention relates to a semiconductor device.

2. Related Art

Patent Document 1 describes about a contact trench being "shallower than the gate trench 4 and extends through the n+ type emitter region 5 and the body p layer 6 to the p type base region 3 located below the body p layer 6."

PRIOR ART DOCUMENT

[Patent Document]
[Patent Document 1]: Japanese Patent Application Publication No. 2010-267863

DESCRIPTION OF EXEMPLARY EMBODIMENTS

Figure 1A:
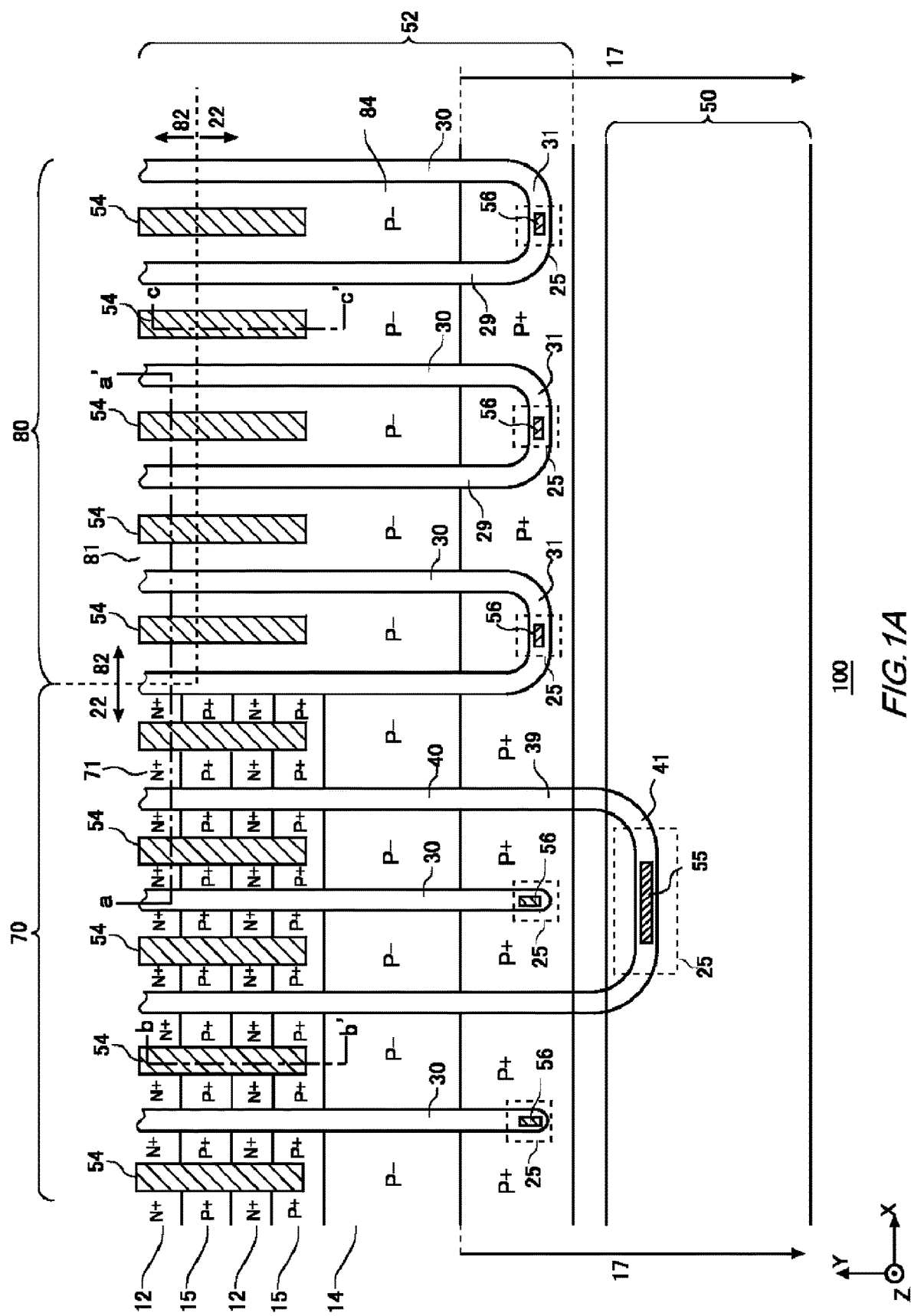
FIG. 1A illustrates one example of a top view of a semiconductor device 100 according to Example 1.

Hereinafter, the present invention will be described through embodiments of the invention, but the following embodiments do not limit the invention according to the claims. In addition, not all the combinations of features described in the embodiments may be essential for means to solve the problem of the present invention.

As used herein, one side in a direction parallel to a depth direction of a semiconductor substrate will be referred to as "upper", and the other side will be referred to as "lower". One of two main surfaces of a substrate, a layer, or another member will be referred to as an upper surface, and the other surface is referred to as a lower surface. Directions described with the phrases "upper", "lower", "front", and "back" are not limited to the gravitational direction, or an attachment direction onto a substrate or the like upon mounting a semiconductor device.

As used herein, technical matters may be described with orthogonal coordinate axes consisting of an X axis, a Y axis, and a Z axis. As used herein, a plane parallel to a front surface of a semiconductor substrate will be referred to as an XY plane, and a depth direction of the semiconductor substrate will be referred to as the Z axis. Additionally, as used herein, a view of the semiconductor substrate seen in the Z axis direction will be referred to as a planar view.

In each example, a first conductivity type is described as N type and a second conductivity type is described as P type. However, the first conductivity type and the second conductivity type may also be of P type and N type, respectively. In that case, each of the conductivity types of substrates, layers, regions or the like would be of inverse polarity in each example.

As used herein, a layer or region denoted by the character "N" or "P" is meant to have electrons or holes respectively as a majority carrier. In addition, a layer or region denoted by the symbol "+" or "−" attached to the character N or P represents that the layer or region has a higher doping concentration or a lower doping concentration respectively, than a layer or region without this symbol. Further, the symbol "++" represents that a doping concentration is higher than "+", and the symbol "−−" represents that a doping concentration is lower than "−".

As used herein, a doping concentration refers to a concentration of a donor or a dopant that has turned into an acceptor. Therefore, a unit thereof is/cm$^3$. As used herein, a doping concentration may be a difference in concentration between donors and acceptors (that is, a net doping concentration). In that case, the doping concentration can be measured by using the SRP method. The doping concentration may also be a chemical concentration of donors and acceptors. In that case, the doping concentration can be measured by the SIMS method. Unless otherwise specified, any of the above may be used as the doping concentration. Unless otherwise specified, a peak value of a doping concentration distribution in a doped region may be regarded as the doping concentration of this doped region.

As used herein, the term "dose amount" refers to the number of ions per unit area, which are implanted into a wafer while performing ion implantation. Therefore, a unit thereof is/cm$^2$. Note that, a dose amount for a semiconductor region can be regarded as an integrated concentration obtained by integrating doping concentration across the semiconductor region in the depth direction. A unit for the integrated concentration is/cm$^2$. Therefore, the dose amount and the integrated concentration may be treated as being the same thing. The integrated concentration may also be regarded as an integral value up to the full width at half maximum, and if a spectrum of another semiconductor region overlaps, impact of the other semiconductor region may be disregarded in order to obtain the integrated concentration.

Accordingly, a level of the doping concentration can be comprehended as a level of the dose amount in this specification. That is, if a doping concentration of one region is higher than a doping concentration of another region, it can be understood that a dose amount for the one region is higher than a dose amount for the another region.

FIG. 1A illustrates one example of a top view of a semiconductor device 100 according to Example 1. The semiconductor device 100 includes a semiconductor substrate that has a transistor portion 70 including a transistor device such as an IGBT, and a diode portion 80 including a diode device such as a freewheeling diode (FWD). For example, the semiconductor device 100 is a reverse conducting IGBT (RC-IGBT).

As used herein, when simply referred to as a "plan view", it means that the semiconductor substrate is seen from its front surface side. In the present example, an X axis refers to an arrangement direction of the transistor portion 70 and the diode portion 80, a Y axis refers to a direction perpendicular to the X axis on the front surface of the semiconductor substrate, and a Z axis refers to a direction perpendicular to the front surface of the semiconductor substrate in the plan view.

Each of the transistor portion 70 and the diode portion 80 may be longitudinal along an extending direction. That is, a length of the transistor portion 70 in the Y axis direction is greater than a width of the transistor portion 70 in the X axis direction. Similarly, a length of the diode portion 80 in the Y axis direction is greater than a width of the diode portion 80 in the X axis direction. The extending directions of the transistor portion 70 and the diode portion 80 may be the same as a longitudinal direction of each trench portion to be described later.

The transistor portion 70 is a region where the collector region 22 provided at the back surface side of the semiconductor substrate is projected onto the front surface of the semiconductor substrate 10. The collector region 22 of the present example is of P+ type, by way of example. The transistor portion 70 includes a transistor such as an IGBT.

In the transistor portion 70, an N type emitter region 12, a P type base region 14, and a gate trench portion 40 including a gate conductive portion and a gate insulating film are arranged at regular intervals on the front surface side of the semiconductor substrate.

The diode portion 80 is a region where the cathode region 82 provided at the back surface side of the semiconductor substrate 10 is projected onto the front surface of the semiconductor substrate 10. The cathode region 82 of the present example is of N+ type, by way of example. The diode portion 80 includes a diode such as a freewheeling diode (FWD) provided so as to be in direct contact with the transistor portion 70 on the front surface of the semiconductor substrate 10. The back surface of the semiconductor substrate 10 may be provided with a collector region being of P+ type in a region excluding the cathode region.

The semiconductor substrate may be a silicon substrate, a silicon carbide substrate, or a nitride semiconductor substrate and so forth of gallium nitride or the like. The semiconductor substrate of the present example is a silicon substrate.

The semiconductor device 100 of the present example includes a gate trench portion 40, a dummy trench portion 30, an emitter region 12, a base region 14, a contact region 15, a well region 17 and an anode region 84, which are provided on the front surface side of the semiconductor substrate. Each of the gate trench portion 40 and the dummy trench portion 30 is one example of the trench portion.

The semiconductor device 100 of the present example also includes a gate metal layer 50 and an emitter electrode 52, which are provided above the front surface of the semiconductor substrate. An interlayer dielectric film is provided between the emitter electrode 52 and the gate metal layer 50, and the front surface of the semiconductor substrate, although it is omitted in FIG. 1A. The interlayer dielectric film of the present example is provided with contact holes 54, 55, and 56 which penetrate through the interlayer dielectric film. In FIG. 1A, each contact hole is hatched with oblique lines.

The emitter electrode 52 is provided above the gate trench portion 40, the dummy trench portion 30, the emitter regions 12, the base region 14, the contact region 15, the well region 17, and the anode region 84. The emitter electrode 52 is electrically connected to the emitter region 12, the base region 14, the contact region 15, and the anode region 84 which are on the front surface of the semiconductor substrate through the contact hole 54.

The emitter electrode 52 and the gate metal layer 50 are formed of a material containing metal. At least a part of a region of the emitter electrode 52 may be formed of aluminum, or alloy of which main component is aluminum (for example, aluminum-silicon alloy, aluminum-silicon-copper alloy, or the like). At least a part of a region of the gate metal layer 50 may be formed of aluminum, or alloy of which main component if aluminum (for example, aluminum-silicon alloy, aluminum-silicon-copper alloy, or the like).

The emitter electrode 52 and the gate metal layer 50 may include a barrier metal formed of titanium, titanium compound, or the like under the region formed of aluminum and the like. The emitter electrode 52 and the gate metal layer 50 are apart from each other.

The contact hole 55 connects a gate conductive portion within the gate trench portion 40 in the transistor portion 70 and the gate metal layer 50. In the contact hole 55, a plug formed of tungsten or the like may be provided through a barrier metal.

The contact hole 56 connects dummy conductive portions in the dummy trench portions 30 provided in the transistor portion 70 and the diode portion 80, and the emitter electrode 52. In the contact hole 56, a plug formed of tungsten or the like may be provided through a barrier metal.

A connecting portion 25 electrically connects the emitter electrode 52, or an electrode on a front surface side of the gate metal layer 50, or the like and the semiconductor substrate. In one example, the connecting portion 25 is provided in a region between the gate metal layer 50 and the gate conductive portion, where an inside of the contact hole 55 is included. The connecting portion 25 is also provided in a region between the emitter electrode 52 and the dummy conductive portion, where an inside of the contact hole 56 is included.

The connecting portion 25 is formed of a conductive material including metal such as tungsten, and polysilicon doped with impurities. In addition, the connecting portion 25 may also have a barrier metal formed of titanium nitride or the like. In the present example, the connecting portion 25 is formed of polysilicon (N+) doped with N type impurities. The connecting portion 25 is provided above the front surface of the semiconductor substrate through a dielectric film such as an oxide film, or the like.

Gate trench portions 40 are arranged at a predetermined interval along a predetermined arrangement direction (the X axis direction in the present example). The gate trench portion 40 of the present example may have two extending portions 39 extending along an extending direction (the Y axis direction in the present example) being parallel to the front surface of the semiconductor substrate and perpendicular to the arrangement direction, and a connecting portion 41 for connecting the two extending portions 39 together.

Preferably, at least a part of the connecting portion 41 is formed into a curved shape. By connecting end portions of the two extending portions 39 of the gate trench portion 40, electric field strength at the end portions of the extending portions 39 can be reduced. The gate metal layer 50 may be connected to the gate conductive portion at the connecting portion 41 of the gate trench portion 40.

The dummy trench portion 30 is a trench portion in which, a dummy conductive portion provided therein is electrically connected to the emitter electrode 52. Similar to the gate trench portions 40, the dummy trench portions 30 are arranged at a predetermined interval along a predetermined arrangement direction (the X axis direction in the present example). Similar to the gate trench portion 40, the dummy trench portion 30 of the present example may be in a U shape on the front surface of the semiconductor substrate. That is, the dummy trench portion 30 may include two extending portions 29 which extend along the extending direction, and a connecting portion 31 which connects the two extending portions 29 together.

The transistor portion 70 of the present example has structure in which one gate trench portion 40 and one dummy trench portion 30 are arranged alternatively and repeatedly. In other words, the transistor portion 70 of the present example has the gate trench portions 40 and the dummy trench portions 30 at a ratio of 1:1. For example, in the transistor portion 70, extending portions 39 and extending portions 29 are alternately provided in the arrangement direction.

The ratio of the gate trench portions 40 and the dummy trench portions 30 is not limited to that of the present example. The ratio of the gate trench portions 40 and the dummy trench portions 30 may be 2:3, or may also be 2:4. Alternatively, the transistor portion 70 may have full gate structure provided with not dummy trench portions 30 but gate trench portions 40 only.

The well region 17 is provided on the front surface side of the semiconductor substrate than the drift region 18 to be described later. The well region 17 is one example of a well region provided on an edge side of the semiconductor device 100. The well region 17 is of P+ type, by way of example. Each well region 17 is provided from an end of an active region on a side of the gate metal layer 50 across a predetermined area.

A diffusion depth of the well region 17 may be deeper than depths of the gate trench portion 40 and the dummy trench portion 30. The well region 17 is provided with parts of regions of the gate trench portions 40 and the dummy trench portions 30 on the gate metal layer 50 side. The bottoms of ends of the gate trench portion 40 and the dummy trench portion 30 in the extending direction may be covered by the well region 17.

The contact hole 54 is provided above each region of the emitter region 12 and the contact region 15 in the transistor portion 70. The contact hole 54 is also provided above the anode region 84 in the diode portion 80. No contact holes 54 are provided above the well region 17 provided at two ends in the Y axis direction. In this way, the interlayer dielectric film is provided with one or more contact holes 54. The contact hole 54 of the present example may extend in the extending direction.

A mesa portion 71 and a mesa portion 81 are mesa portions provided so as to be in direct contact with the trench portion in a plane parallel to the front surface of the semiconductor substrate. The mesa portion may be a portion of the semiconductor substrate, which is sandwiched by two adjacent trench portions, and may range from the front surface of the semiconductor substrate to a depth at the lowermost bottom of each trench portion. An extending portion of the each trench portion may be regarded as one trench portion. That is, a region sandwiched by two extending portions may be regarded as the mesa portion.

The mesa portion 71 is provided in the transistor portion 70 so as to be in direct contact with at least one of the dummy trench portion 30 or the gate trench portion 40. The mesa portion 71 has the well region 17, the emitter region 12, the base region 14, and the contact region 15, on the front surface of the semiconductor substrate. In the mesa portion 71, the emitter region 12 and the contact region 15 are alternately provided in the extending direction.

The mesa portion 81 is provided in a region sandwiched by dummy trench portions 30 that are adjacent to each other in the diode portion 80. The mesa portion 81 of the present example has an anode region 84 on the front surface of the semiconductor substrate, and a well region 17 on a side in a negative direction of the Y axis. The mesa portion 81 may be provided with the contact region 15 on a front surface of the anode region 84.

The base region 14 is a region in the transistor portion 70, which is provided on the front surface side of the semiconductor substrate. The anode region 84 is a region in the diode portion 80, which is provided on the front surface side of the semiconductor substrate. The base region 14 and the anode region 84 are of P− type, by way of example.

The doping concentration of the anode region 84 is lower than the doping concentration of the base region 14. The doping concentration of the anode region 84 is from 1E16 $cm^{-3}$ to 1E17 $cm^{-3}$ inclusive, and the doping concentration of the base region 14 is from 1E17 $cm^{-3}$ to 1E18 $cm^{-3}$ inclusive. Note that, the character E represents "10 to power of", thus 1E16 $cm^{-3}$ represents $1\times10^{16}$ $cm^{-3}$, for example. In the present example, by lowering the doping concentration of the anode region 84, holes can be prevented from being injected during reverse recovery.

The emitter region 12 is of the same conductivity type as that of the drift region 18, and has a doping concentration higher than that of the drift region 18. The emitter region 12 of the present example is of N+ type, by way of example. One example of a dopant in the emitter region 12 is arsenic (As). The emitter region 12 is in direct contact with the gate trench portion 40 on a front surface of the mesa portion 71. The emitter region 12 may extend from one to the other trench portions sandwiching the mesa portion 71 in the X axis direction.

In addition, the emitter region 12 may be or may not be in direct contact with the dummy trench portion 30. The emitter region 12 of the present example is in direct contact with the dummy trench portion 30. The emitter region 12 is not provided in the mesa portions 81.

The contact region 15 is of the same conductivity type as that of the base region 14, and has a doping concentration higher than that of the base region 14. The contact region 15 of the present example is of the P+ type, by way of example. The contact region 15 of the present example is provided on the front surface of the mesa portion 71. The contact region 15 may be provided from one to the other trench portions sandwiching the mesa portion 71 in the X axis direction. The contact region 15 may be or may not be in direct contact with the gate trench portion 40. Furthermore, the contact region 15 may be or may not be in direct contact with the dummy trench portion 30. In the present example, the contact region 15 is in direct contact with the dummy trench portion 30 and the gate trench portion 40.

Figure 1B:
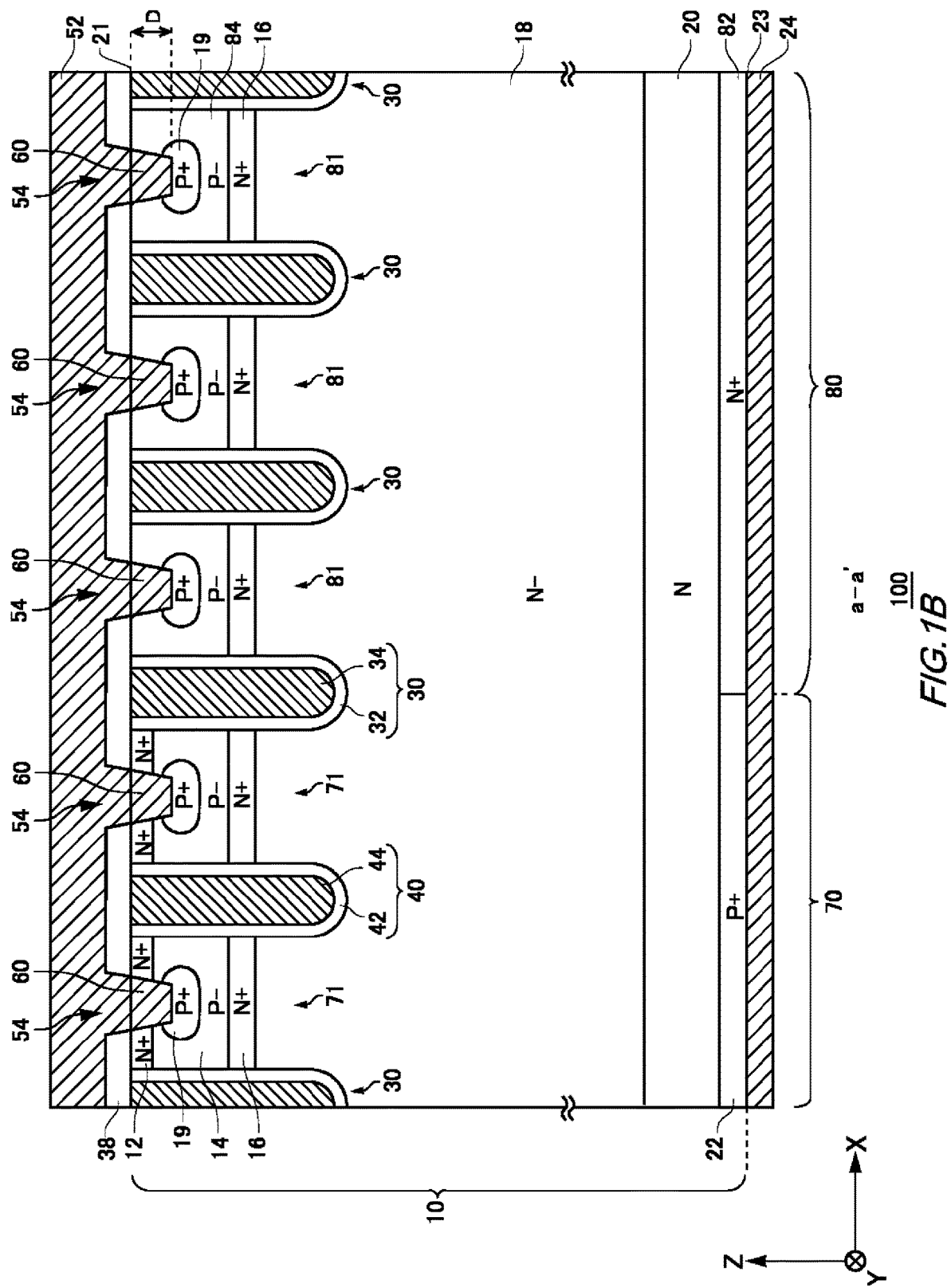
FIG. 1B illustrates one example of a cross-section taken along the line a-a' of FIG. 1A.

FIG. 1B illustrates one example of a cross-section taken along the line a-a' of FIG. 1A. The cross-section a-a' is on an XZ plane passing through the emitter region 12 in the transistor portion 70. The semiconductor device 100 of the present example includes the semiconductor substrate 10, the interlayer dielectric film 38, the emitter electrode 52, and the collector electrode 24 in the cross-section a-a'. The emitter electrode 52 is provided above the semiconductor substrate 10 and the interlayer dielectric film 38.

The drift region 18 is provided in the semiconductor substrate 10. The drift region 18 of the present example is of N− type, by way of example. The drift region 18 may be a region in the semiconductor substrate 10 where no doped region is formed and therefore remained. That is, a doping concentration of the drift region 18 may be a doping concentration of the semiconductor substrate 10.

The buffer region 20 is a region provided below the drift region 18. The buffer region 20 of the present example may be of the same conductivity type as that of the drift region 18, for example, be of N type. A doping concentration of the buffer region 20 is higher than the doping concentration of the drift region 18. The buffer region 20 may function as a field stop layer for preventing a depletion layer, which spreads from the lower surface side of the base region 14, from reaching the collector region 22 and the cathode region 82.

The collector region 22 is a region below the buffer region 20 in the transistor portion 70, and is of the conductivity type different from that of the drift region 18. The cathode region 82 is a region below the buffer region 20 in the diode portion 80, and is of the same conductivity type as that of the drift region 18. A boundary between the collector region 22 and the cathode region 82 is a boundary between the transistor portion 70 and the diode portion 80.

The collector electrode 24 is provided on a back surface 23 of the semiconductor substrate 10. The collector electrode 24 is formed of a conductive material such as metal.

The base region 14 is a region provided above the drift region 18 in the mesa portion 71, and having a conductivity type different from the of the drift region 18. The base region 14 of the present example is of P− type, by way of example. The base region 14 is provided so as to be in direct contact with the gate trench portion 40. The base region 14 may be provided so as to be in direct contact with the dummy trench portion 30.

The anode region 84 is a region provided above the drift region 18 in the mesa portion 81, and having a conductivity type different from that of the drift region 18. The anode region 84 of the present example is of P− type, by way of example. The anode region 84 is provided so as to be in direct contact with the dummy trench portion 30.

The emitter region 12 is provided between the base region 14 and a front surface 21. The emitter region 12 of the present example is provided in the mesa portion 71, and not provided in the mesa portions 81. The emitter region 12 is provided so as to be in direct contact with the gate trench portion 40. The emitter region 12 may be or may not be in direct contact with the dummy trench portion 30.

When the diode portion 80 is brought into conduction, electron current flows from the cathode region 82 to the anode region 84. When the electron current reaches the anode region 84, conductivity modulation occurs and hole current flows from the anode region 84. In addition, electron current diffused from the cathode region 82 facilitates holes to be injected from the contact region 15 of the transistor portion 70, and thereby hole density increases in the semiconductor substrate 10. Because of that, it takes longer in time for the holes to disappear when the diode portion 80 is turned off, by which a reverse recovery peak current becomes large and also a reverse recovery loss becomes large.

A technique for preventing such hole current is known, in which a lifetime control region including lifetime killers is provided on the front surface side of the semiconductor substrate. By way of example, the lifetime killers are electron lines implanted to the entire semiconductor substrate or helium, an electron line, or proton etc. implanted to a predetermined depth thereof. The lifetime control region is crystal defect formed in the semiconductor substrate by implanting the lifetime killers. The lifetime control region facilitates electrons and holes, which are generated when a diode portion is brought into conduction, to be eliminated in recombination, and thus reduces reverse recovery losses.

In the present example, the lifetime control region including the lifetime killers is not provided on a front surface 21 side of the semiconductor substrate 10. In the present example, by lowering the doping concentration of the anode region 84, holes can be prevented from being injected during reverse recovery even when a lifetime control region is not provided.

A trench contact portion 60 electrically connects the emitter electrode 52 and the semiconductor substrate. The trench contact portion 60 is provided continuously from the contact hole 54. The trench contact portion 60 of the present example is provided in each of the mesa portion 71 and mesa portion 81.

The trench contact portion 60 contains a conductive material filled in the contact hole 54. The trench contact portion 60 is provided between two adjacent trench portions among a plurality of trench portions. The trench contact portion 60 of the present example penetrates through the emitter region 12 from the front surface 21, so that a lower end of the trench contact portion 60 comes into contact with a plug region 19. The trench contact portion 60 may contain the same material as that of the emitter electrode 52.

In the trench contact portion 60 and the contact hole 54, a barrier metal formed of titanium, a titanium compound, or the like may be provided. Also, in the trench contact portion 60 and the contact hole 54, a plug formed of tungsten or the like may be provided through the barrier metal.

Also, the lower end of the trench contact portion 60 is positioned deeper than the position of the lower end of the emitter region 12. By providing the trench contact portion 60, resistance in the base region 14 decreases, and thus extracting minority carriers (holes, for example) becomes easier. This can improve a withstand capability for breakage including a withstand capability for a latch up caused due to the minority carriers. For example, a distance between the lower end of the emitter region 12 and the front surface 21 is from 0.3 μm to 0.4 μm inclusive, and a distance D between the lower end of the trench contact portion 60 and the front surface 21 is from 0.35 μm to 0.6 μm inclusive.

For example, the trench contact portion 60 is formed by etching the interlayer dielectric film 38. The trench contact portion 60 has a bottom surface having a substantially planar shape. The trench contact portion 60 of the present example is in a tapered shape with inclined side walls. Note that, the side wall of the trench contact portion 60 may be provided so as to be substantially perpendicular to the front surface 21.

Each plug region 19 in the mesa portion 71 and the mesa portion 81 is provided at the lower end of the trench contact portion 60. The plug region 19 is of the same conductivity type as those of the base region 14 and the anode region 84, and has a higher doping concentration than those of the base region 14 and the anode region 84. The plug region 19 of the present example is of P+ type, by way of example.

For example, the plug region 19 is formed through implanting ion being boron (B) or boron fluoride ($BF_2$) from the lower end of the trench contact portion 60. The plug region 19 may have the same doping concentration than that of the contact region 15. The doping concentration of the plug region 19 of the present example is from $1E20 \text{ cm}^{-3}$ to $1E21 \text{ cm}^{-3}$ inclusive. The plug region 19 prevents a latch up by extracting minority carriers.

The plug region 19 spreads from the lower end of the trench contact portion 60 and covers at least a part of the side wall of the trench contact portion 60. In the transistor portion 70, the emitter region 12 is not in direct contact with the plug region 19 on the side wall of the trench contact portion 60. The side wall of the trench contact portion 60 in the transistor portion 70 is covered by the emitter region 12, the base region 14, and the plug region 19. That is, in the transistor portion 70, the side wall of the trench contact portion 60 is in direct contact with the base region 14.

In the present example, since the emitter region 12 and the plug region 19 are in direct contact with the trench contact portion 60 in the transistor portion 70, carriers can be prevented from being injected from the emitter region 12 and thereby a withstand capability for breakage can be improved. In addition, even when a large current flows into the semiconductor device 100, efficiency of minority carrier extraction can be improved by virtue of the plug region 19, and thus potential of the base region 14 can be stabilized.

Further, in the present example, by providing the plug region 19 in the diode portion 80 also, a low doping concentration in the anode region 84 can be compensated, and thus an ohmic contact can be reliably formed.

The accumulation region 16 is a region provided on a side closer to the front surface 21 of the semiconductor substrate 10 than the drift region 18. The accumulation region 16 of the present example is of the same conductivity type as the that of the drift region 18, for example, is of N+ type. The accumulation region 16 is provided in the transistor portion 70 and the diode portion 80. Note that, no accumulation region 16 may be provided in some cases.

In addition, the accumulation region 16 is provided so as to be in direct contact with the gate trench portion 40. The accumulation region 16 may be or may not be in direct contact with the dummy trench portion 30. A doping concentration of the accumulation region 16 is higher than the doping concentration of the drift region 18. The dose amount for ion implantation into the accumulation region 16 may be from $1E12$ $cm^{-2}$ to $1E13$ $cm^{-2}$ inclusive. The dose amount of ion implantation into the accumulation region 16 may also be from $3E12$ $cm^{-2}$ to $6E12$ $cm^{-2}$ inclusive. By providing the accumulation region 16, carrier injection enhancement effect (IE effect) can be increased, and thereby can reduce the ON voltage of the transistor portion 70.

One or more gate trench portions 40 and one or more dummy trench portions 30 are provided on the front surface 21. Each trench portion is provided from the front surface 21 to the drift region 18. In a region provided with at least any of the emitter region 12, the base region 14, the contact region 15, and the accumulation region 16, the each trench portion penetrates through these regions and reaches the drift region 18. The phrase "the trench portion penetrates through the doped region" does not limit to that manufactured in the order of forming a doped region and then forming a trench portion. That manufactured in the order of forming trench portions and then forming a doped region between the trench portions is also included as what is described by "the trench portion penetrates through the doped region".

The gate trench portion 40 includes a gate trench, a gate insulating film 42, and a gate conductive portion 44 which are provided on the front surface 21. The gate insulating film 42 is provided so as to cover an inner wall of the gate trench. The gate insulating film 42 may be formed by oxidizing or nitriding a semiconductor on the inner wall of the gate trench. The gate conductive portion 44 is provided on an inner side from the gate insulating film 42 in the gate trench.

The gate insulating film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21.

The gate conductive portion 44 includes a region facing the base region 14 being adjacent to the gate conductive portion 44 on a mesa portion 71 side by sandwiching the gate insulating film 42 in the depth direction of the semiconductor substrate 10. When a predetermined voltage is applied to the gate conductive portion 44, a channel is formed on a surface layer being at a boundary within the base region 14 and in direct contact with the gate trench, due to an electron inversion layer.

The dummy trench portion 30 may have the same structure as that of the gate trench portion 40. The dummy trench portion 30 includes a dummy trench, a dummy dielectric film 32 and a dummy conductive portion 34 which are provided on the front surface 21 side. The dummy dielectric film 32 is provided so as to cover an inner wall of the dummy trench. The dummy conductive portion 34 is provided in the dummy trench, on an inner side from the dummy dielectric film 32. The dummy dielectric film 32 insulates the dummy conductive portion 34 from the semiconductor substrate 10. The dummy trench portion 30 is covered by the interlayer dielectric film 38 on the front surface 21.

The interlayer dielectric film 38 is provided on the front surface 21. The emitter electrode 52 is provided above the interlayer dielectric film 38. The interlayer dielectric film 38 is provided with one or more contact holes 54 for electrically connecting the emitter electrode 52 and the semiconductor substrate 10 together. The contact hole 55 and the contact hole 56 may also penetrate through the interlayer dielectric film 38.

Figure 1C:
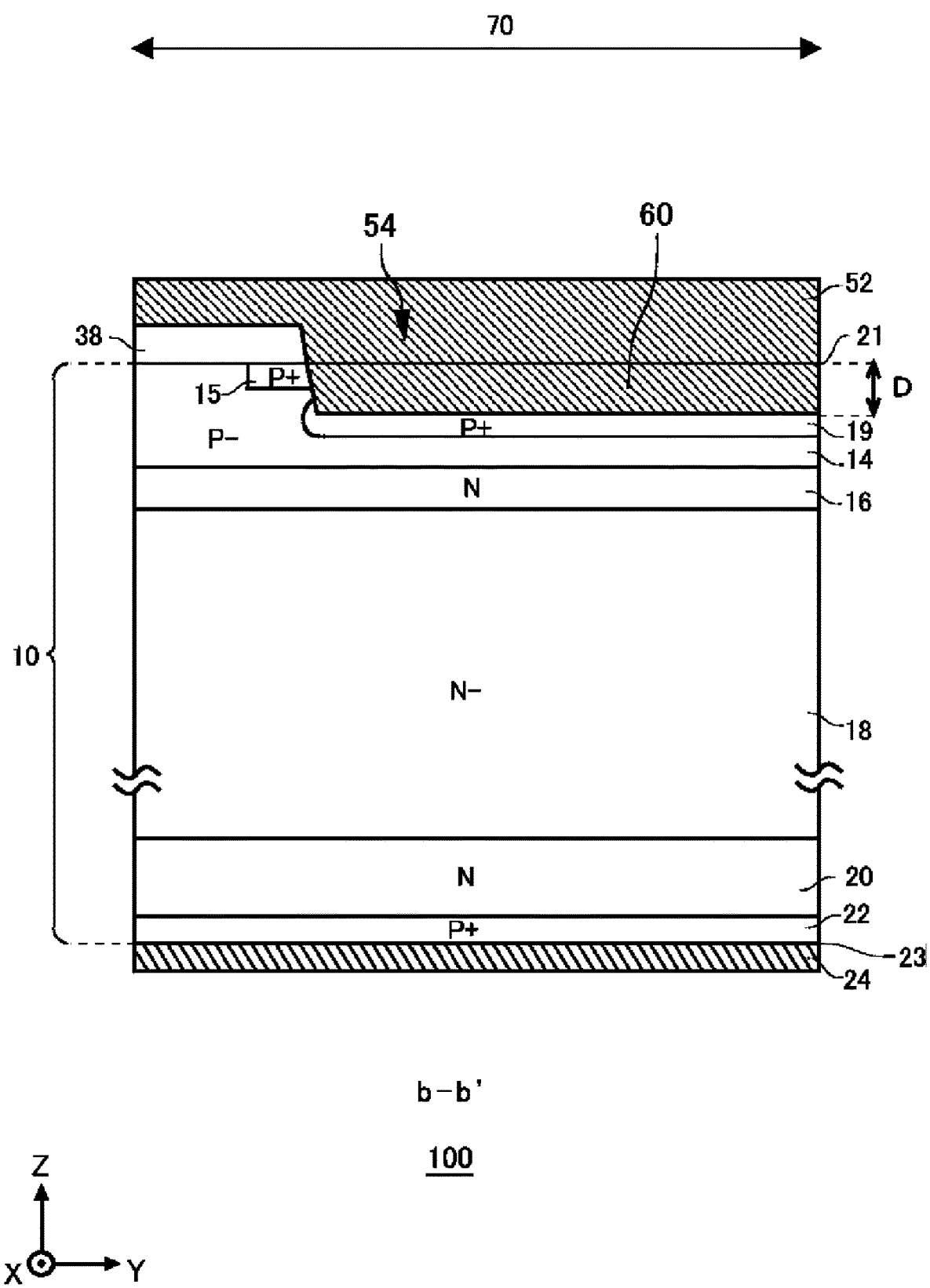
FIG. 1C illustrates one example of a cross-section taken along the line b-b' of FIG. 1A.

FIG. 1C illustrates one example of a cross-section taken along the line b-b' of FIG. 1A. The cross-section b-b' is on a XY plane passing through the contact hole 54 along its longitudinal direction in the transistor portion 70.

In the transistor portion 70, the contact hole 54 and the trench contact portion 60 extend in the extending direction. That is, in the transistor portion 70, the trench contact portions 60 of the present example are arranged in a stripe pattern along the gate trench portions 40 and the dummy trench portions 30.

In the transistor portion 70, the plug region 19 may extend in the Y axis direction. In other words, in the transistor portion 70, the plug region 19 extends along the lower end of the trench contact portion 60.

Figure 1D:
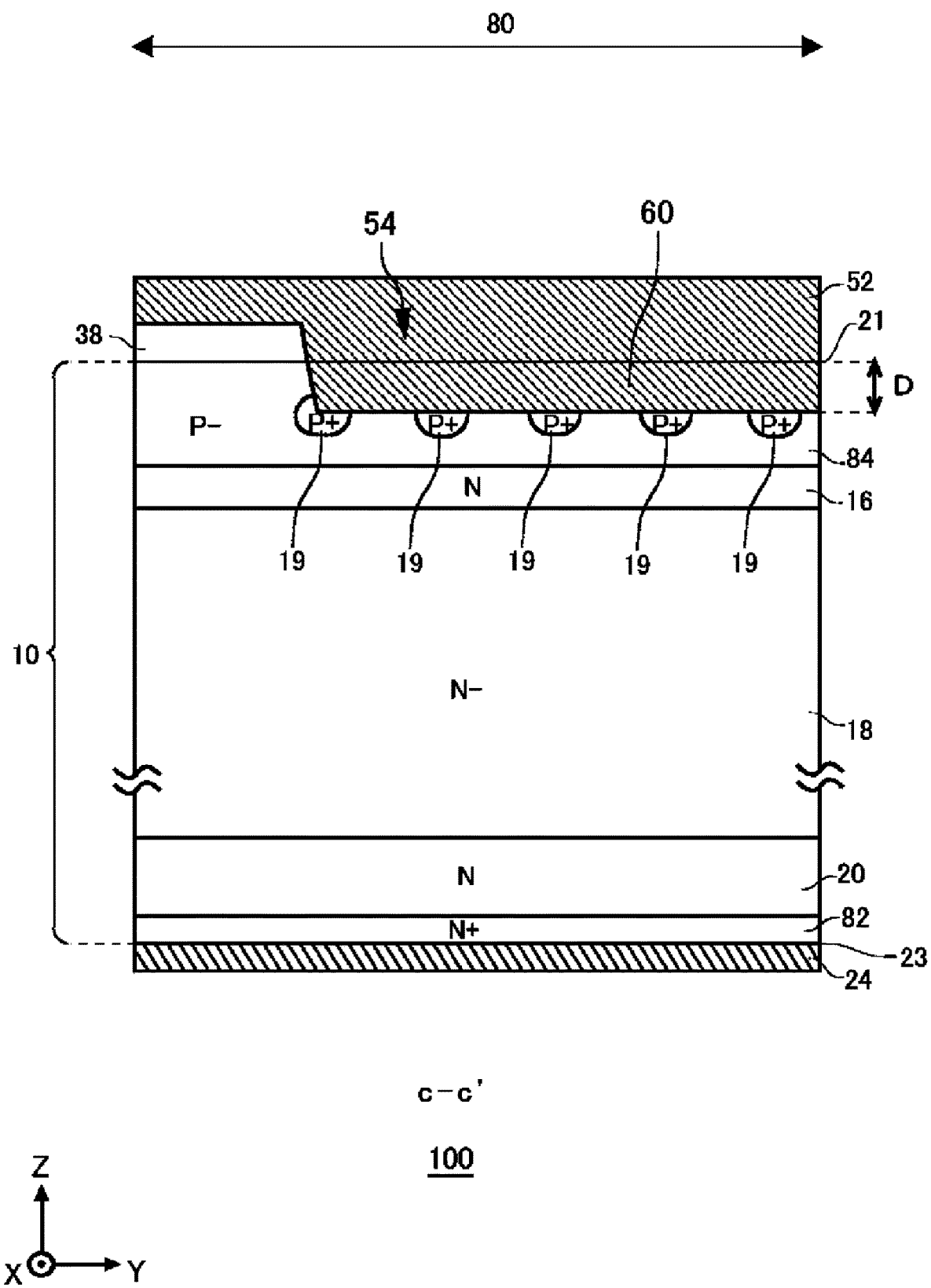
FIG. 1D illustrates one example of a cross-section taken along the line c-c' of FIG. 1A.

FIG. 1D illustrates one example of a cross-section taken along the line c-c' of FIG. 1A. The cross-section c-c' is on a XY plane passing through the contact hole 54 along its longitudinal direction in the diode portion 80.

In the diode portion 80, the contact hole 54 and the trench contact portion 60 extend in the Y axis direction, similar to those in the transistor portion 70. That is, in the diode portion 80, the trench contact portions 60 of the present example are arranged in a stripe pattern along the dummy trench portions 30.

On the other hand, in the diode portion 80, plug regions 19 are provided separately from each other along the Y axis direction. That is, in the diode portion 80, a plurality of plug regions 19 is provided in a dot shape and apart from each other in the Y axis direction. Therefore, a length in the Y axis direction of the plug region 19 provided in the transistor portion 70 is longer than a length in the Y axis direction of the plug region 19 provided in the diode portion 80.

In the diode portion 80, the plug region 19 only covers a part of the lower end of the trench contact portion 60 extending in the Y axis direction. A part of the lower end of the trench contact portion 60 where no plug region 19 is provided is in direct contact with the anode region 84. That is, at the lower end of the trench contact portion 60, the anode region 84 and the plug region 19 are alternately provided along the Y axis direction.

As above, in the present example, the trench contact portions 60 are provided in both of the transistor portion 70 and the diode portion 80. Thereby, the number of processes is reduced compared to a case in which the trench contact portion 60 is provided only in the transistor portion 70, and only the contact hole 54 is provided in the diode portion 80.

In addition, since the plug regions 19 are provided separately from each other in the diode portion 80 instead of extending in the Y axis direction, a doping concentration can be prevented from being increased in a region provided with an anode region 84, and thereby holes can be prevented from being injected during reverse recovery.

Figure 2:
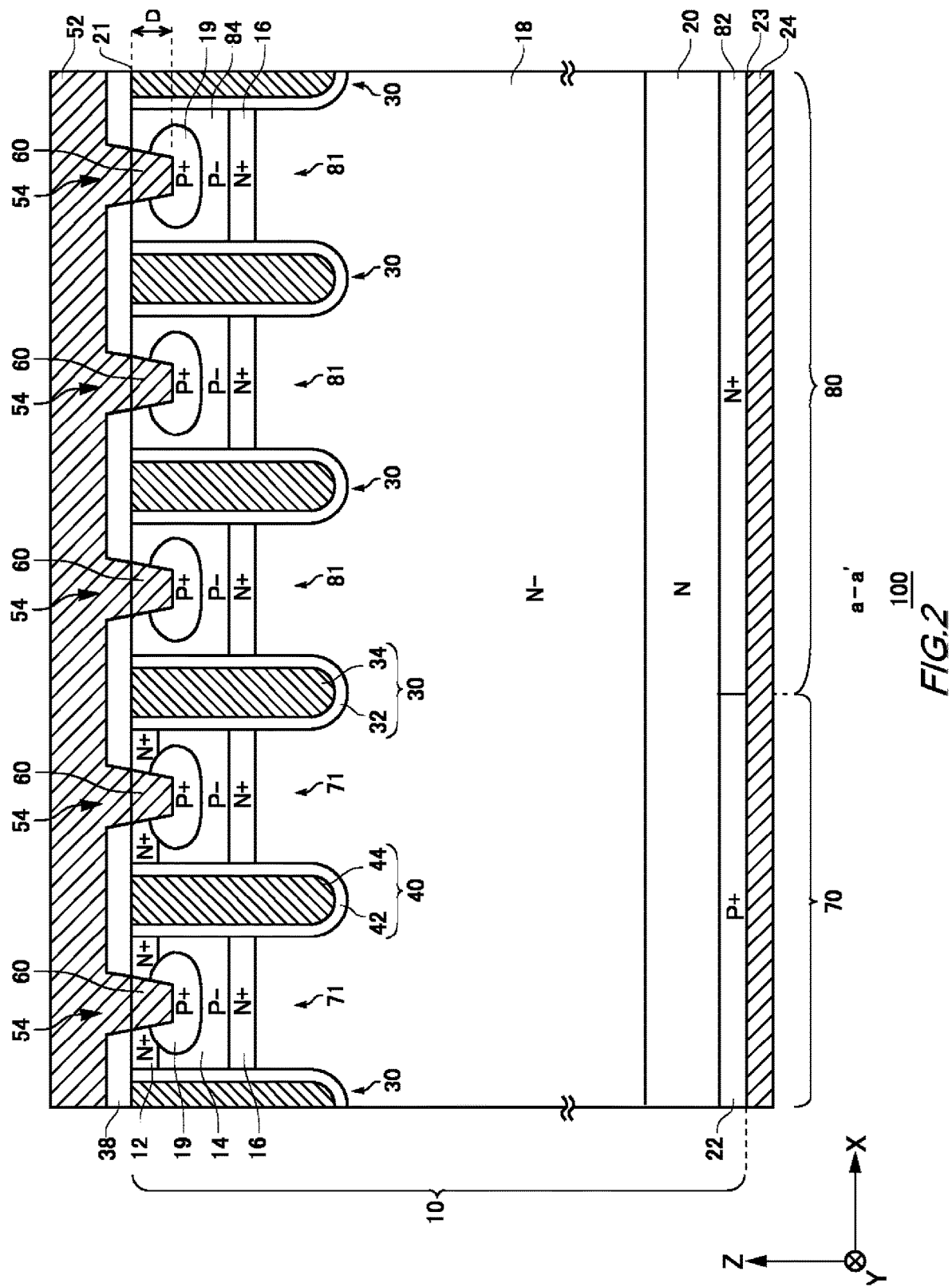
FIG. 2 illustrates another example of a cross-section taken along the line a-a' of FIG. 1A.

FIG. 2 illustrates another example of a cross-section taken along the line a-a' of FIG. 1A. The plug region 19 spreads from the lower end of the trench contact portion 60 and covers at least a part of the side wall of the trench contact portion 60. The plug region 19 of the present example is different from that in the example of FIG. 1B on a point that it is in direct contact with the emitter region 12 on the side wall of the trench contact portion 60 in the transistor portion 70. In the present example, the side wall of the trench contact portion 60 in the transistor portion 70 is covered by the emitter region 12 and the plug region 19. That is, in the transistor portion 70, the trench contact portion 60 is not in direct contact with the base region 14.

In the present example, similar to the example of FIG. 1B, since the emitter region 12 is in direct contact with the plug region 19 in the transistor portion 70, carriers can be prevented from being injected from the emitter region 12 and thereby a withstand capability for breakage can be improved. In addition, even when a large current flows into the semiconductor device 100, efficiency of minority carrier extraction can be improved by virtue of the plug region 19, and thus potential of the base region 14 can be stabilized.

In the present example, the trench contact portion 60 is provided only in a region provided with the plug region 19 in the diode portion 80. In other words, the lower end of the trench contact portion 60 is covered by the plug region 19, and is not in direct contact with the anode region 84.

The semiconductor device 100 of the present example has a low doping concentration in the anode region 84, thereby a depletion layer easily spreads in the anode region 84 during reverse recovery. When a voltage between an anode and a cathode is greatly increased and the depletion layer reaches the lower end of the trench contact portion 60, since there is a crystal defect caused by etching at the lower end of the trench contact portion 60, breakage easily occurs.

In the present example, since the lower end of the trench contact portion 60 is covered by the plug region 19, the depletion layer stops at the plug region 19 without reaching the lower end of the trench contact portion 60. In this way, breakage can be prevented from occurring at the lower end of the trench contact portion 60.

Figure 3A:
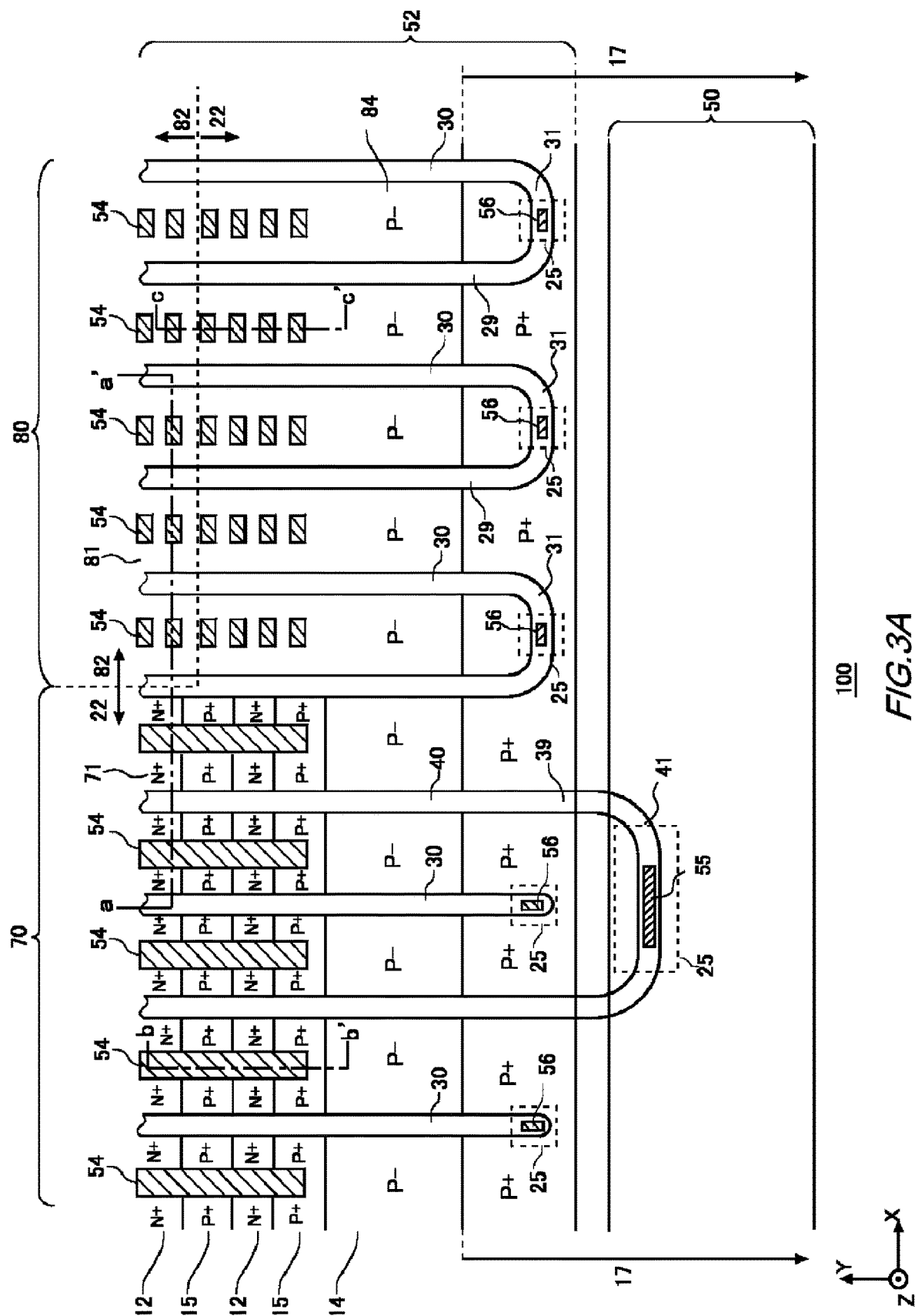
FIG. 3A illustrates one example of a top view of a semiconductor device 100 according to Example 2.
Figure 3B:
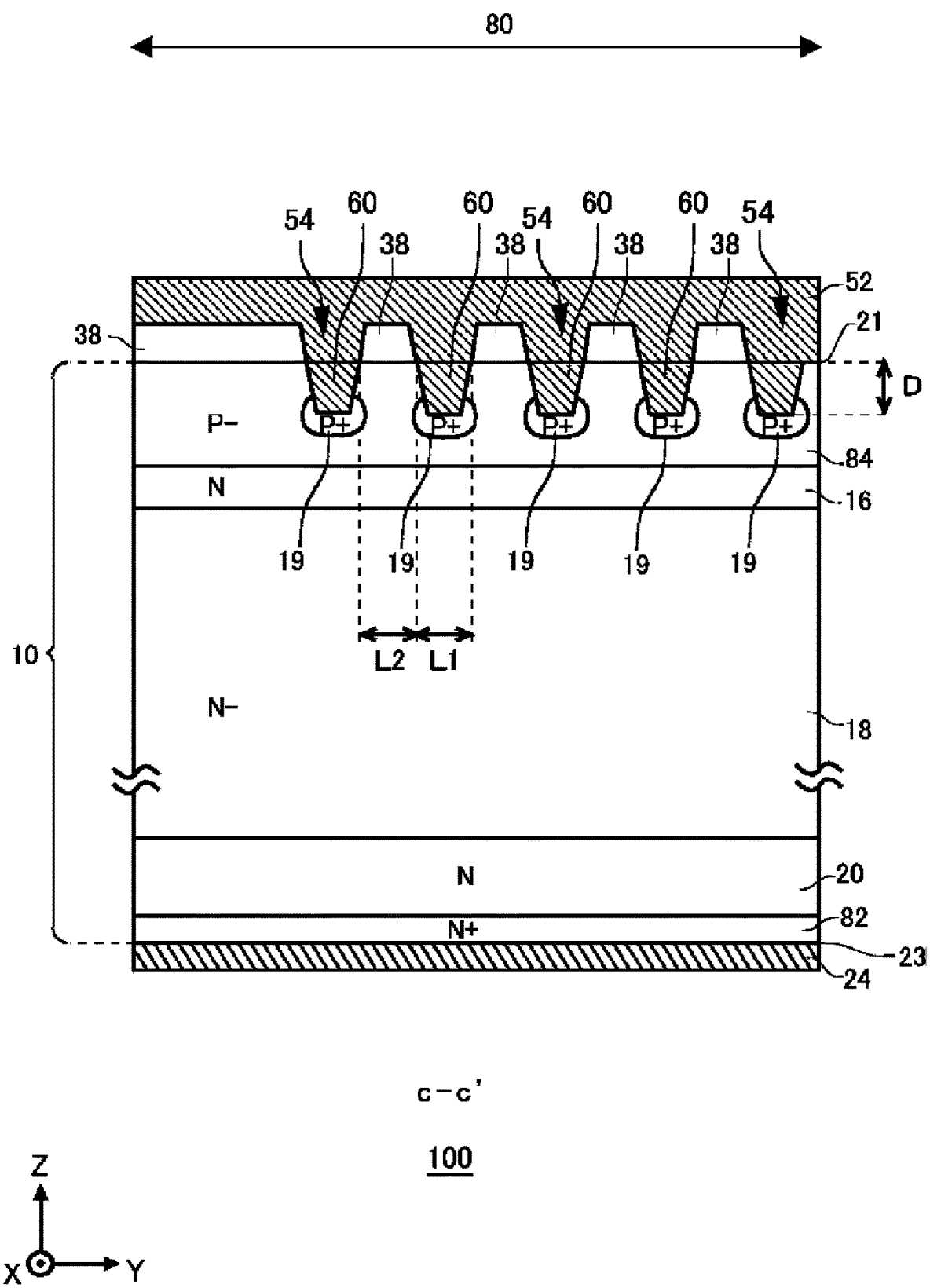
FIG. 3B illustrates one example of a cross-section taken along the line c-c' of FIG. 3A.

FIG. 3A illustrates one example of a top view of a semiconductor device 100 according to Example 2. FIG. 3B illustrates one example of a cross-section taken along the line c-c' of FIG. 3A. Because structure of the transistor portion 70 in the semiconductor device 100 of the present example is the same as that of the semiconductor device 100 according to Example 1, what is mainly discussed below is a configuration of the diode portion 80. Also, because a cross-section a-a' and a cross-section b-b' of FIG. 3A are the same as the cross-section a-a' and the cross-section b-b' illustrated in FIG. 1B and FIG. 1C, respectively, illustrations are omitted for them.

In the diode portion 80, contact holes 54 are provided separately from each other in the Y axis direction. That is, in the diode portion 80, a plurality of contact holes 54 is provided in a dot shape and apart from each other in the Y axis direction.

Similarly, in the diode portion 80, a plurality of trench contact portions 60 is provided separately from each other. That is, in the diode portion 80, a plurality of trench contact portions 60 is provided in a dot shape and apart from each other in the Y axis direction.

In the diode portion 80, a lower end of the trench contact portion 60 is covered by the plug region 19. The plug region 19 spreads from the lower end of the trench contact portion 60 and covers at least a part of the side wall of the trench contact portion 60. The side wall of the trench contact portion 60 in the diode portion 80 is covered by the anode region 84 and the plug region 19. In the Y axis direction, a length L1 of the trench contact portion 60 of the present example is from 0.6 µm to 50 µm inclusive, and a length L2 between trench contact portions 60 being adjacent to each other is from 1 µm to 50 µm inclusive. The length described here may be a distance taken on an upper end of the trench contact portion 60, i.e., on a front surface 21.

The semiconductor device 100 of the present example has a low doping concentration in the anode region 84, thereby a depletion layer easily spreads in the anode region 84 during reverse recovery. When a voltage between an anode and a cathode is greatly increased and the depletion layer reaches the lower end of the trench contact portion 60, since there is a crystal defect caused by etching at the lower end of the trench contact portion 60, breakage easily occurs.

In the present example, since the lower end of the trench contact portion 60 is covered by the plug region 19, the depletion layer stops at the plug region 19 without reaching the lower end of the trench contact portion 60. In this way, breakage can be prevented from occurring at the lower end of the trench contact portion 60.

As above, by providing the trench contact portions 60 and the plug regions 19 separately from each other in the diode portion 80, holes can be prevented from being injected during reverse recovery and breakage can be prevented from occurring at the lower end of the trench contact portion 60 even without providing the lifetime control region on the front surface 21 side.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, stages etc. of each process performed by an apparatus, system, program, and method shown in the claims, specification, or diagrams can be performed in any order as long as the order is not indicated by "prior to", "before", or the like and as long as the output from a previous process is not used in a later process. Even if the process flow is described using phrases such as "first" or "next" in the claims, specification, or diagrams, it does not necessarily mean that the process must be performed in this order.

EXPLANATION OF REFERENCES

10: semiconductor substrate;
12: emitter region;
14: base region;
15: contact region;
16: accumulation region;
17: well region;
18: drift region;
19: plug region;
20: buffer region;
21: front surface;
22: collector region;
23: back surface;
24: collector electrode;
25: connecting portion;
29: extending portion;
30: dummy trench portion;
31: connecting portion;
32: dummy dielectric film;
34: dummy conductive portion;
38: interlayer dielectric film;
39: extending portion;
40: gate trench portion;
41: connecting portion;
42: gate insulating film;
44: gate conductive portion;
50: gate metal layer;
52: emitter electrode;
54: contact hole;
55: contact hole;
56: contact hole;
60: trench contact portion;
70: transistor portion;
71: mesa portion;
80: diode portion;
81: mesa portion;
82: cathode region;
84: anode region;
100: semiconductor device

What is claimed is:

1. A semiconductor device, comprising:
a semiconductor substrate having a diode portion, wherein
the diode portion includes,
an anode region which is provided on a front surface of the semiconductor substrate and is of a second conductivity type, and
a trench portion provided so as to extend in a predetermined extending direction on the front surface of the semiconductor substrate,
a trench contact portion provided on the front surface of the semiconductor substrate, and
a plug region which is provided at a lower end of the trench contact portion and is of a second conductivity type, and which has a doping concentration higher than that of the anode region, wherein
ones of the plug region are provided separately from each other along the extending direction; and
a transistor portion having an emitter region which is provided on the front surface of the semiconductor substrate; wherein
the lower end of the trench contact portion is positioned deeper than a lower end of the emitter region.

2. The semiconductor device according to claim 1, wherein a plurality of the trench contact portions is provided separately from each other.

3. The semiconductor device according to claim 2, wherein the plug region is provided so as to cover the lower end of the trench contact portion.

4. The semiconductor device according to claim 3, wherein a length of the trench contact portion is from 0.6 µm to 50 µm inclusive, and a distance between trench contact portions being adjacent to each other is from 1 µm to 50 µm inclusive in the extending direction.

5. The semiconductor device according to claim 1, wherein the trench contact portion is configured to extend in the extending direction, and the anode region and the plug region are provided at the lower end of the trench contact portion.

6. The semiconductor device according to claim 5, wherein the anode region and the plug region are alternately provided along the extending direction at the lower end of the trench contact portion.

7. The semiconductor device according to claim 1, wherein:
the transistor portion has a base region which is provided on the front surface of the semiconductor substrate and is of a second conductivity type, wherein
a doping concentration of the anode region is lower than a doping concentration of the base region.

8. The semiconductor device according to claim 7, wherein the doping concentration of the anode region is from $1E16$ $cm^{-3}$ to $1E17$ $cm^{-3}$ inclusive, and the doping concentration of the base region is from $1E17$ $cm^{-3}$ to $1E18$ $cm^{-3}$ inclusive.

9. The semiconductor device according to claim 7, wherein
the emitter region is of a first conductivity type.

10. The semiconductor device according to claim 8, wherein
the emitter region is of a first conductivity type.

11. The semiconductor device according to claim 9, wherein the lower end of the trench contact portion is positioned at a depth of from 0.35 µm to 0.6 µm inclusive from the front surface of the semiconductor substrate.

12. The semiconductor device according to claim 7, wherein the trench contact portion is also provided in the transistor portion.

13. The semiconductor device according to claim 8, wherein the trench contact portion is also provided in the transistor portion.

14. The semiconductor device according to claim 12, wherein
the plug region is also provided at the lower end of the trench contact portion in the transistor portion, and
a length of the plug region in the transistor portion is longer than a length of the plug region in the diode portion in the extending direction.

15. The semiconductor device according to claim 1, wherein the diode portion further has an accumulation region which is provided on the semiconductor substrate and is of a first conductivity type.

16. The semiconductor device according to claim 1, wherein a doping concentration of the plug region is from $1E20$ $cm^{-3}$ to $1E21$ $cm^{-3}$ inclusive.

17. The semiconductor device according to claim 1, wherein a front surface side of the semiconductor substrate is not provided with a lifetime control region including a lifetime killer.

\* \* \* \* \*